United States Patent
Katrak et al.

(10) Patent No.: US 9,964,599 B2
(45) Date of Patent: May 8, 2018

(54) DIAGNOSTIC SYSTEM FOR A DC-DC VOLTAGE CONVERTER

(71) Applicant: LG Chem, Ltd., Seoul (KR)

(72) Inventors: Kerfegar K. Katrak, Fenton, MI (US); Mehdi Rexha, Sterling Heights, MI (US)

(73) Assignee: LG Chem, Ltd., Seoul (KR)

( * ) Notice: Subject to any disclaimer, the term of this patent is extended or adjusted under 35 U.S.C. 154(b) by 144 days.

(21) Appl. No.: 15/249,376

(22) Filed: Aug. 27, 2016

(65) Prior Publication Data
US 2017/0363692 A1  Dec. 21, 2017

Related U.S. Application Data

(60) Provisional application No. 62/352,217, filed on Jun. 20, 2016.

(51) Int. Cl.
| | |
|---|---|
| *G01R 31/40* | (2014.01) |
| *G01K 13/00* | (2006.01) |
| *G01R 31/327* | (2006.01) |
| *H02M 3/158* | (2006.01) |

(52) U.S. Cl.
CPC ............ *G01R 31/40* (2013.01); *G01K 13/00* (2013.01); *G01R 31/327* (2013.01); *H02M 3/158* (2013.01)

(58) Field of Classification Search
CPC ..... G01R 31/40; G01R 31/327; H02M 3/158; H02M 1/14; H02M 1/084; H02M 1/36; H02M 2001/0009; H02M 3/04; H02M 3/157; H02M 7/04; G01K 13/00
See application file for complete search history.

(56) References Cited

U.S. PATENT DOCUMENTS

| | | | |
|---|---|---|---|
| 6,741,436 B2 | 5/2004 | Gilbert et al. | |
| 8,385,030 B2 | 2/2013 | Maher | |
| 9,784,771 B1 * | 10/2017 | Katrak | ............ G01R 19/16528 |

OTHER PUBLICATIONS

U.S. Appl. No. 15/246,887, filed Aug. 25, 2016 entitled Diagnostic System for a DC-DC Voltage Converter.
U.S. Appl. No. 15/247,087, filed Aug. 25, 2016 entitled Diagnostic System for a DC-DC Voltage Converter.

* cited by examiner

*Primary Examiner* — Minh Phan
*Assistant Examiner* — Zannatul Ferdous
(74) *Attorney, Agent, or Firm* — Buckert Patent & Trademark Law Firm PC; John F. Buckert

(57) ABSTRACT

A diagnostic system for a DC-DC voltage converter is provided. The diagnostic system includes a first temperature sensor generating a first output voltage indicating a temperature level of a high voltage bi-directional MOSFET switch. The diagnostic system includes a microcontroller that samples the first output voltage at a first sampling rate utilizing a first channel in a first bank of channels to obtain a first predetermined number of voltage samples. The microcontroller determines a first number of voltage samples in the first predetermined number of voltage samples in which the first output voltage is greater than a first threshold voltage. The microcontroller sets a first temperature diagnostic flag equal to a first fault value if the first number of voltage samples is greater than a first threshold number of voltage samples indicating the high voltage bi-directional MOSFET switch has an over-temperature condition.

8 Claims, 13 Drawing Sheets

DIAGNOSTIC SYSTEM FOR A DC-DC VOLTAGE CONVERTER

CROSS-REFERENCE TO RELATED APPLICATION

This application claims priority to U.S. Provisional Patent Application No. 62/352,217 filed on Jun. 20, 2016, the entire contents of which are hereby incorporated by reference herein.

BACKGROUND

The inventors herein have recognized a need for an improved diagnostic system for a DC-DC voltage converter. The diagnostic system provides a technical effect of obtaining diagnostic diversity by sampling a first output voltage from a first temperature sensor using a first channel of a first bank of channels in an analog-to-digital converter, and then sampling a second output voltage from a second temperature sensor using a first channel of a second bank of channels in the analog-to-digital converter, to determine over-temperature conditions in a high voltage bi-directional MOSFET switch and a low voltage bi-directional MOSFET switch, respectively, in the DC-DC voltage converter, and if so, then inducing the high voltage bi-directional MOSFET switch and the low voltage bi-directional MOSFET switch to each transition to an open operational state.

SUMMARY

A diagnostic system for a DC-DC voltage converter in accordance with an exemplary embodiment is provided. The DC-DC voltage converter has a high voltage bi-directional MOSFET switch and a low voltage bi-directional MOSFET switch. The diagnostic system includes a first temperature sensor generating a first output voltage indicating a temperature level of the high voltage bi-directional MOSFET switch. The diagnostic system further includes a second temperature sensor generating a second output voltage indicating a temperature level of the low voltage bi-directional MOSFET switch. The diagnostic system further includes a microcontroller having an analog-to-digital converter. The analog-to-digital converter has a first bank of channels and a second bank of channels. The first bank of channels has a first channel, and the second bank of channels has a second channel. The first channel is electrically coupled to the first temperature sensor for receiving the first output voltage. The second channel is electrically coupled to the second temperature sensor for receiving the second output voltage. The microcontroller is programmed to sample the first output voltage at a first sampling rate utilizing the first channel in the first bank of channels to obtain a first predetermined number of voltage samples. The microcontroller is further programmed to determine a first number of voltage samples in the first predetermined number of voltage samples in which the first output voltage is greater than a first threshold voltage. The microcontroller is further programmed to set a first temperature diagnostic flag equal to a first fault value if the first number of voltage samples is greater than a first threshold number of voltage samples indicating the high voltage bi-directional MOSFET switch has an over-temperature condition. The microcontroller is further programmed to sample the second output voltage at the first sampling rate utilizing the second channel in the second bank of channels to obtain a second predetermined number of voltage samples. The microcontroller is further programmed to determine a second number of voltage samples in the second predetermined number of voltage samples in which the second output voltage is greater than a second threshold voltage. The microcontroller is further programmed to set a second temperature diagnostic flag equal to a second first fault value if the second number of voltage samples is greater than the first threshold number of voltage samples indicating the low voltage bi-directional MOSFET switch has the over-temperature condition.

A diagnostic system for a DC-DC voltage converter in accordance with another exemplary embodiment is provided. The DC-DC voltage converter has a high voltage bi-directional MOSFET switch and a low voltage bi-directional MOSFET switch. The diagnostic system includes a first temperature sensor generating a first output voltage indicating a temperature level of the high voltage bi-directional MOSFET switch. The diagnostic system further includes a second temperature sensor generating a second output voltage indicating a temperature level of the low voltage bi-directional MOSFET switch. The diagnostic system further includes a microcontroller having an analog-to-digital converter. The analog-to-digital converter has a first bank of channels and a second bank of channels. The first bank of channels has a first channel, and the second bank of channels has a second channel. The first channel is electrically coupled to the first temperature sensor for receiving the first output voltage. The second channel is electrically coupled to the second temperature sensor for receiving the second output voltage. The microcontroller is programmed to sample the first output voltage at a first sampling rate utilizing the first channel in the first bank of channels to obtain a first predetermined number of voltage samples. The microcontroller is further programmed to determine a first number of voltage samples in the first predetermined number of voltage samples in which the first output voltage is equal to a first non-functional voltage. The microcontroller is further programmed to set a first temperature diagnostic flag equal to a first fault value if the first number of voltage samples is greater than a first threshold number of voltage samples indicating that the analog-to-digital converter is malfunctioning. The microcontroller is further programmed to sample the second output voltage at the first sampling rate utilizing the second channel in the second bank of channels to obtain a second predetermined number of voltage samples. The microcontroller is further programmed to determine a second number of voltage samples in the second predetermined number of voltage samples in which the second output voltage is equal to a second non-functional voltage. The microcontroller is further programmed to set a second temperature diagnostic flag equal to a second first fault value if the second number of voltage samples is greater than the first threshold number of voltage samples indicating the analog-to-digital converter is malfunctioning.

A diagnostic system for a DC-DC voltage converter in accordance with another exemplary embodiment is provided. The DC-DC voltage converter has first and second MOSFET switches in a DC-DC converter control circuit. The diagnostic system includes a first temperature sensor generating a first output voltage indicating a temperature level of the first MOSFET switch. The diagnostic system further includes a second temperature sensor generating a second output voltage indicating a temperature level of the second MOSFET switch. The diagnostic system further includes a microcontroller having an analog-to-digital converter. The analog-to-digital converter has a first bank of channels and a second bank of channels. The first bank of channels has a first channel, and the second bank of channels has a second channel. The first channel is electrically coupled to the first temperature sensor for receiving the first output voltage. The second channel is electrically coupled to the second temperature sensor for receiving the second output voltage. The microcontroller is programmed to sample the first output voltage at a first sampling rate utilizing the first channel in the first bank of channels to obtain a first predetermined number of voltage samples. The microcontroller is further programmed to determine a first number of voltage samples in the first predetermined number of voltage samples in which the first output voltage is greater than a first threshold voltage. The microcontroller is further programmed to set a first temperature diagnostic flag equal to a first fault value if the first number of voltage samples is greater than a first threshold number of voltage samples indicating the first MOSFET switch has an over-temperature condition. The microcontroller is further programmed to sample the second output voltage at the first sampling rate utilizing the second channel in the second bank of channels to obtain a second predetermined number of voltage samples. The microcontroller is further programmed to determine a second number of voltage samples in the second predetermined number of voltage samples in which the second output voltage is greater than a second threshold voltage. The microcontroller is further programmed to set a second temperature diagnostic flag equal to a second first fault value if the second number of voltage samples is greater than the first threshold number of voltage samples indicating the second MOSFET switch has the over-temperature condition.

A diagnostic system for a DC-DC voltage converter in accordance with another exemplary embodiment is provided. The DC-DC voltage converter has first and second MOSFET switches in a DC-DC converter control circuit. The diagnostic system includes a first temperature sensor generating a first output voltage indicating a temperature level of the first MOSFET switch. The diagnostic system further includes a second temperature sensor generating a second output voltage indicating a temperature level of the second MOSFET switch. The diagnostic system further includes a microcontroller having an analog-to-digital converter. The analog-to-digital converter has a first bank of channels and a second bank of channels. The first bank of channels has a first channel, and the second bank of channels has a second channel. The first channel is electrically coupled to the first temperature sensor for receiving the first output voltage. The second channel is electrically coupled to the second temperature sensor for receiving the second output voltage. The microcontroller is programmed to sample the first output voltage at a first sampling rate utilizing the first channel in the first bank of channels to obtain a first predetermined number of voltage samples. The microcontroller is further programmed to determine a first number of voltage samples in the first predetermined number of voltage samples in which the first output voltage is equal to a first non-functional voltage. The microcontroller is further programmed to set a first temperature diagnostic flag equal to a first fault value if the first number of voltage samples is greater than a first threshold number of voltage samples indicating the analog-to-digital converter is malfunctioning. The microcontroller is further programmed to sample the second output voltage at the first sampling rate utilizing the second channel in the second bank of channels to obtain a second predetermined number of voltage samples. The microcontroller is further programmed to determine a second number of voltage samples in the second predetermined number of voltage samples in which the second output voltage is greater than a second threshold voltage. The microcontroller is further programmed to set a second temperature diagnostic flag equal to a second first fault value if the second number of voltage samples is greater than the first threshold number of voltage samples indicating the analog-to-digital converter is malfunctioning.

DETAILED DESCRIPTION

Figure 1:
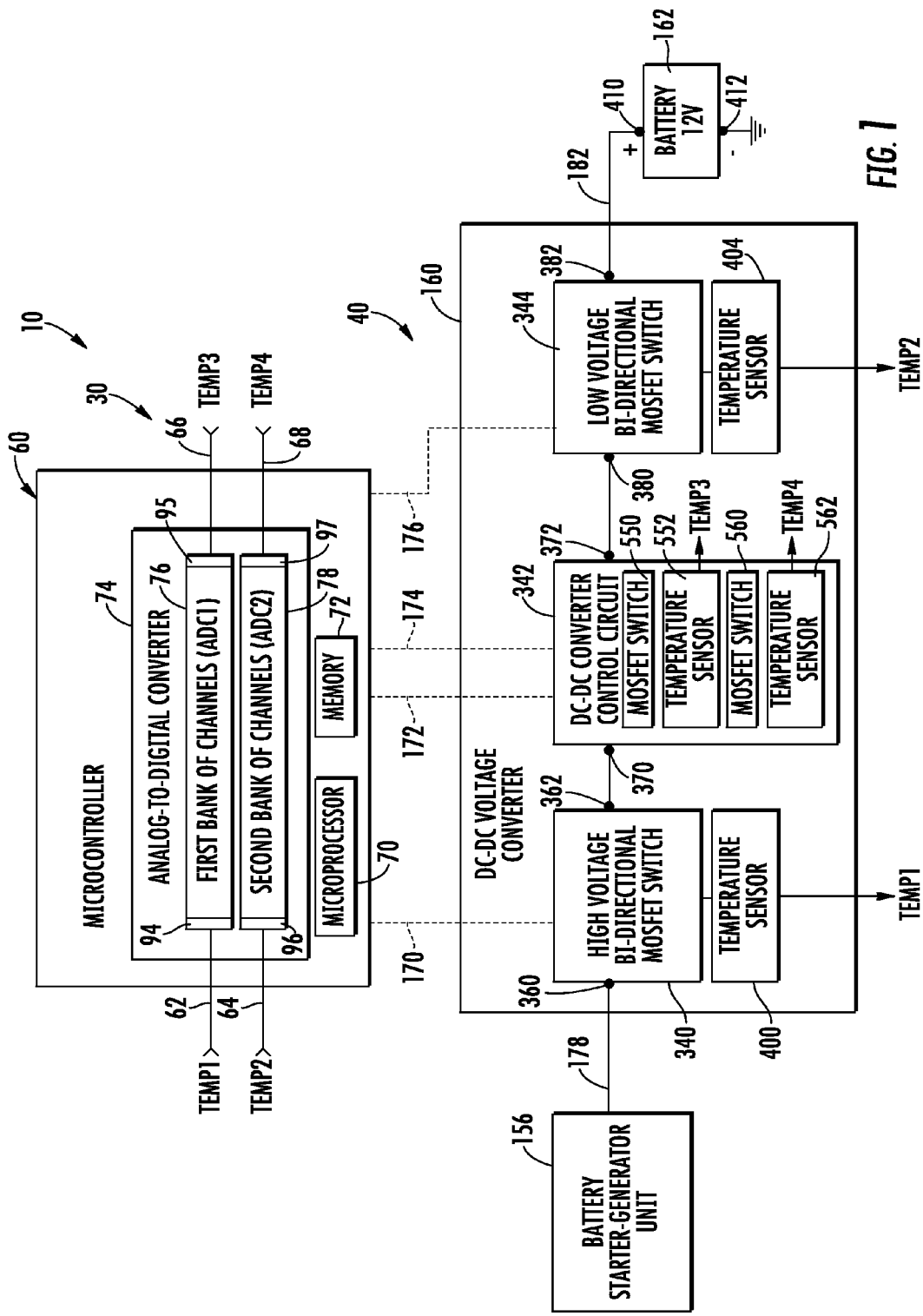
FIG. 1 is a schematic of a vehicle having a diagnostic system for a DC-DC voltage converter in accordance with an exemplary embodiment, and a control circuit.

Referring to FIG. 1, a vehicle 10 includes a diagnostic system 30 for a DC-DC voltage converter 160 in accordance with an exemplary embodiment, and a control circuit 40. An advantage of the diagnostic system 30 is that the system 30 obtains diagnostic diversity by sampling a first output voltage from a first temperature sensor 400 using a first channel 94 of a first bank of channels 76 in an analog-to-digital converter 74, and then sampling a second output voltage from a second temperature sensor 404 using a first channel 96 of a second bank of channels 78 in the analog-to-digital converter 74, to determine over-temperature conditions in a high voltage bi-directional MOSFET switch 340 and a low voltage bi-directional MOSFET switch 344, respectively, in the DC-DC voltage converter 160, and if so, then inducing the high voltage bi-directional MOSFET switch 340 and the low voltage bi-directional MOSFET switch 344 to each transition to an open operational state.

For purposes of understanding a node is a region or a location in an electrical circuit.

The diagnostic system 30 is provided to perform diagnostic tests on the DC-DC voltage converter 160, which will be described in greater detail below. The diagnostic system 30 includes the microcontroller 60, electrical lines 62, 64, 66, 68, a temperature sensor 400, a temperature sensor 404, a temperature sensor 552, and a temperature sensor 562.

The microcontroller 60 includes a microprocessor 70, a memory 72, and the analog-to-digital converter 74. The microcontroller 60 is programmed to perform diagnostic steps (described in flowcharts herein) utilizing the microprocessor 70 which executes software instructions stored in the memory 72. The microprocessor 70 operably communicates with the analog-to-digital converter 74 and the memory 72.

Figure 2:
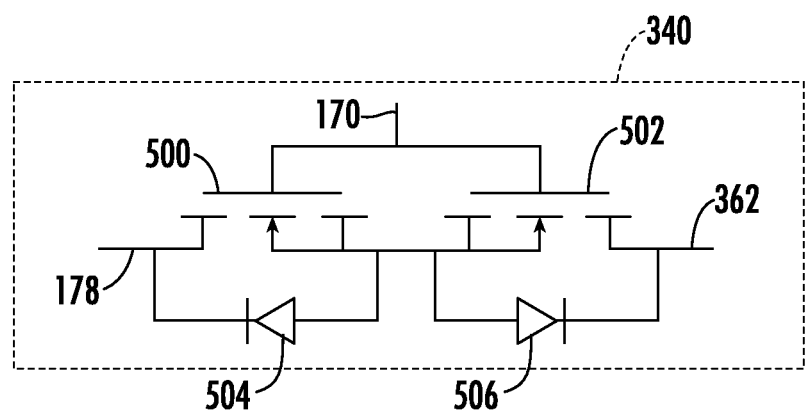
FIG. 2 is a schematic of a bi-directional MOSFET switch utilized in the DC-DC voltage converter of FIG. 1.

Referring to FIGS. 1 and 2, the analog-to-digital converter 74 includes a first bank of channels 76 (also referred to as ADC1 herein) and a second bank of channels 78 (also referred to as ADC2 herein). The first bank of channels 76 includes a channel 94 and a channel 95. The second bank of channels 78 includes a channel 96 and a channel 97.

When the microcontroller 60 utilizes the first bank of channels 76 to sample voltages, the channels 94, 95 sample their respective input voltages and generate voltage values corresponding to their respective input voltages. Further, when the microcontroller 60 utilizes the second bank of channels 78 to sample voltages, the channels 96, 97 sample their respective input voltages and generate voltage values corresponding to their respective input voltages.

The temperature sensor 400 is disposed proximate to the high voltage bi-directional MOSFET switch 340 within the DC-DC voltage converter 160. The temperature sensor 400 generates a first output voltage indicating a temperature level of the high voltage bi-directional MOSFET switch 340, which is received by the channel 94 of the first bank of channels 76 of the analog-to-digital converter 74 via the electrical line 62. Thus, the channel 94 is electrically coupled to the temperature sensor 400 utilizing the electrical line 62.

The temperature sensor 404 is disposed proximate to the low voltage bi-directional MOSFET switch 344 within the DC-DC voltage converter 160. The temperature sensor 404 generates a second output voltage indicating a temperature level of the low voltage bi-directional MOSFET switch 344, which is received by the channel 96 of the second bank of channels 78 of the analog-to-digital converter 74 via the electrical line 64. Thus, the channel 96 is electrically coupled to the temperature sensor 404 utilizing the electrical line 64.

The temperature sensor 552 is disposed proximate to a MOSFET switch 550 that is disposed in the DC-DC converter control circuit 342 within the DC-DC voltage converter 160. The temperature sensor 552 generates a third output voltage indicating a temperature level of the MOSFET switch 550, which is received by the channel 95 of the first bank of channels 76 of the analog-to-digital converter 74 via the electrical line 66. Thus, the channel 95 is electrically coupled to the temperature sensor 552 utilizing the electrical line 66.

The temperature sensor 562 is disposed proximate to a MOSFET switch 560 that is disposed in the DC-DC converter control circuit 342 within the DC-DC voltage converter 160. The temperature sensor 562 generates a fourth output voltage indicating a temperature level of the MOSFET switch 560, which is received by the channel 97 of the second bank of channels 78 of the analog-to-digital converter 74 via the electrical line 68. Thus, the channel 97 is electrically coupled to the temperature sensor 562 utilizing the electrical line 68.

Referring to FIG. 1, the control circuit 40 includes the microcontroller 60, a battery-starter generator unit 156, the DC-DC voltage converter 160, a battery 162, and electrical lines 170, 172, 174, 176, 180, 182.

The DC-DC voltage converter 160 is provided to receive a voltage from the battery-starter generator unit 156 and to output a DC voltage (e.g., 12 Vdc) to the battery 162. The DC-DC voltage converter 160 includes the high voltage bi-directional MOSFET switch 340, a DC-DC control circuit 342, and a low voltage bi-directional MOSFET switch 344.

Referring to FIGS. 1 and 2, the high voltage bi-directional MOSFET switch 340 includes a first node 360 (e.g., an input node) and a second node 362 (e.g., an output node). The first node 360 is electrically coupled to the battery-starter generator unit 156 utilizing the electrical line 180. The second node 362 is electrically coupled to a first node 370 of the DC-DC control circuit 342. In an exemplary embodiment, the high voltage bi-directional MOSFET switch 340 includes MOSFET switches 500, 502 and diodes 504, 506 as illustrated in FIG. 2. Of course, in an alternative embodiment, the high voltage bi-directional MOSFET switch 340 could be replaced with another type of bi-directional switch having desired voltage and current capabilities. When the microcontroller 60 generates a first control signal that is received by the high voltage bi-directional MOSFET switch 340 (or that is received by a controller or a microprocessor within the DC-DC voltage converter 160 that is operably coupled to the switch 340) via the electrical line 170, the switch 340 transitions to a closed operational state. When the microcontroller 60 stops generating the first control signal, the switch 340 transitions to an open operational state.

The DC-DC control circuit 342 has a first node 370 (e.g., an input node) and a second node 372 (e.g., an output node), the MOSFET switch 550, the temperature sensor 552, the MOSFET switch 560, and the temperature sensor 562. The first node 370 is electrically coupled to the second node 362 of the high voltage bi-directional MOSFET switch 340. The second node 372 is electrically coupled to the first node 380 of the low voltage bi-directional MOSFET switch 344.

The MOSFET switches 550 and 560 are internal components of the DC-DC converter control circuit and are provided to convert voltage phases from the battery starter-generator unit 156 to a DC voltage signal. It is noted that the additional pairs of MOSFET switches may be utilized in the DC-DC converter control circuit 342 to convert additional voltage phases from the battery starter-generator unit 156 to DC voltage signals. However, for purposes of simplicity, only the MOSFET switches 550 and 560 are shown.

When the microcontroller 60 generates a third control signal that is received by the MOSFET switch 550 (or that is received by a controller or a microprocessor within the DC-DC voltage converter 160 that is operably coupled to the switch 550) via the electrical line 172, the MOSFET switch 550 transitions to a closed operational state. When the microcontroller 60 stops generating the third control signal, the MOSFET switch 550 transitions to an open operational state. Further, when the microcontroller 60 generates a fourth control signal that is received by the MOSFET switch 560 (or that is received by a controller or a microprocessor within the DC-DC voltage converter 160 that is operably coupled to the switch 560) via the electrical line 174, the MOSFET switch 560 transitions to a closed operational state. When the microcontroller 60 stops generating the fourth control signal, the MOSFET switch 560 transitions to an open operational state.

The low voltage bi-directional MOSFET switch 344 includes a first node 380 (e.g., an input node) and a second node 382 (e.g., an output node). The first node 380 is electrically coupled to the second node 372 of the DC-DC control circuit 342. The second node 382 is electrically coupled to the battery 162 utilizing the electrical line 182. In an exemplary embodiment, the low voltage bi-directional MOSFET switch 344 has an identical structure as the high voltage bi-directional MOSFET switch 340 illustrated in FIG. 2. Of course, in an alternative embodiment, the low voltage bi-directional MOSFET switch 344 could be replaced with another type of bi-directional switch having desired voltage and current capabilities. When the microcontroller 60 generates a second control signal that is received by the low voltage bi-directional MOSFET switch 344 (or that is received by a controller or a microprocessor within the DC-DC voltage converter 160 that is operably coupled to the switch 344) via the electrical line 172, the switch 344 transitions to a closed operational state. When the microcontroller 60 stops generating the second control signal, the switch 344 transitions to an open operational state.

The battery 162 includes a positive terminal 410 and a negative terminal 412. In an exemplary embodiment, the battery 162 generates 12 Vdc between the positive terminal 410 and the negative terminal 412.

Figure 3:
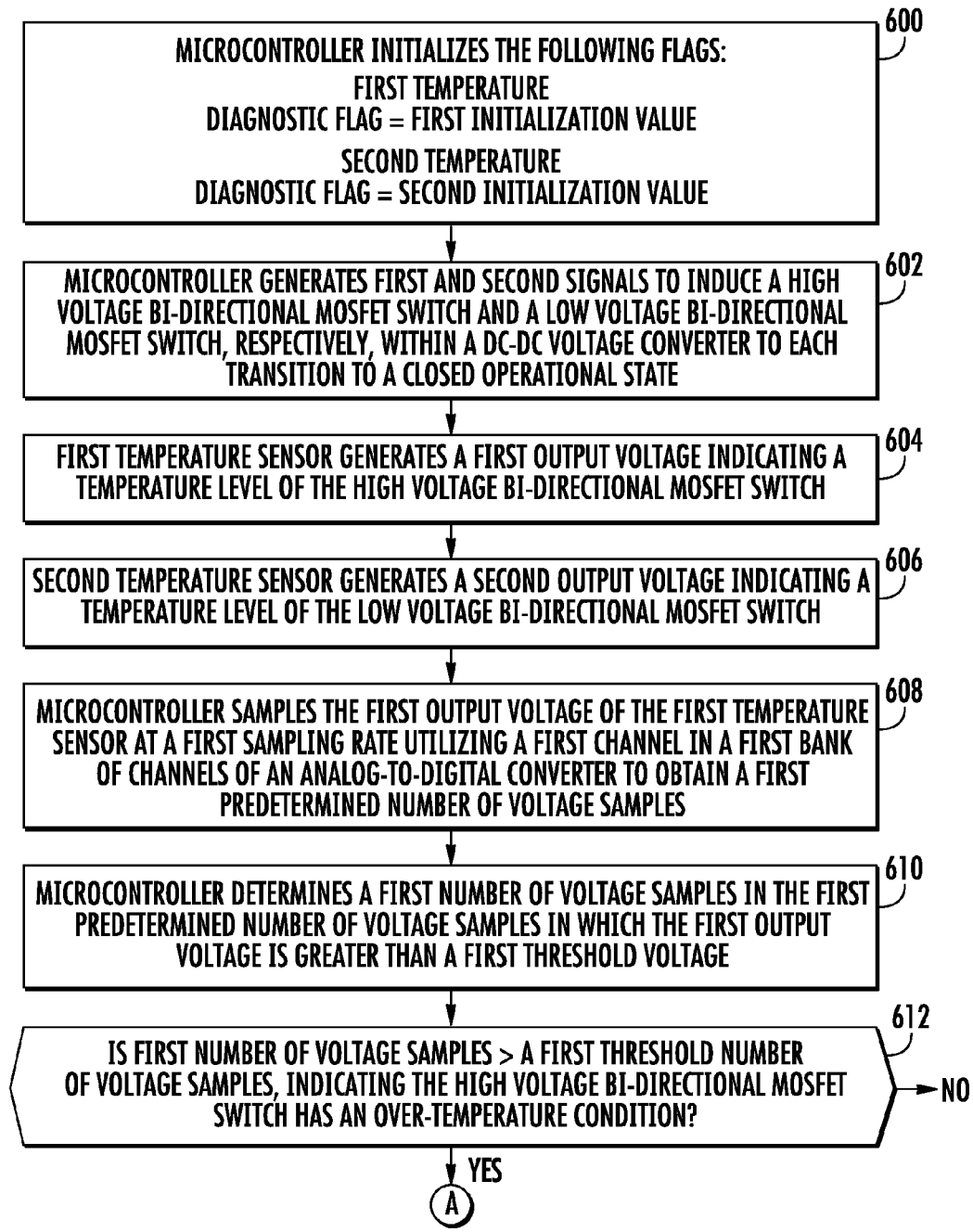
FIGS. 3-4 is a flowchart of a method for performing a first diagnostic test of the DC-DC voltage converter of FIG. 1.
Figure 4:
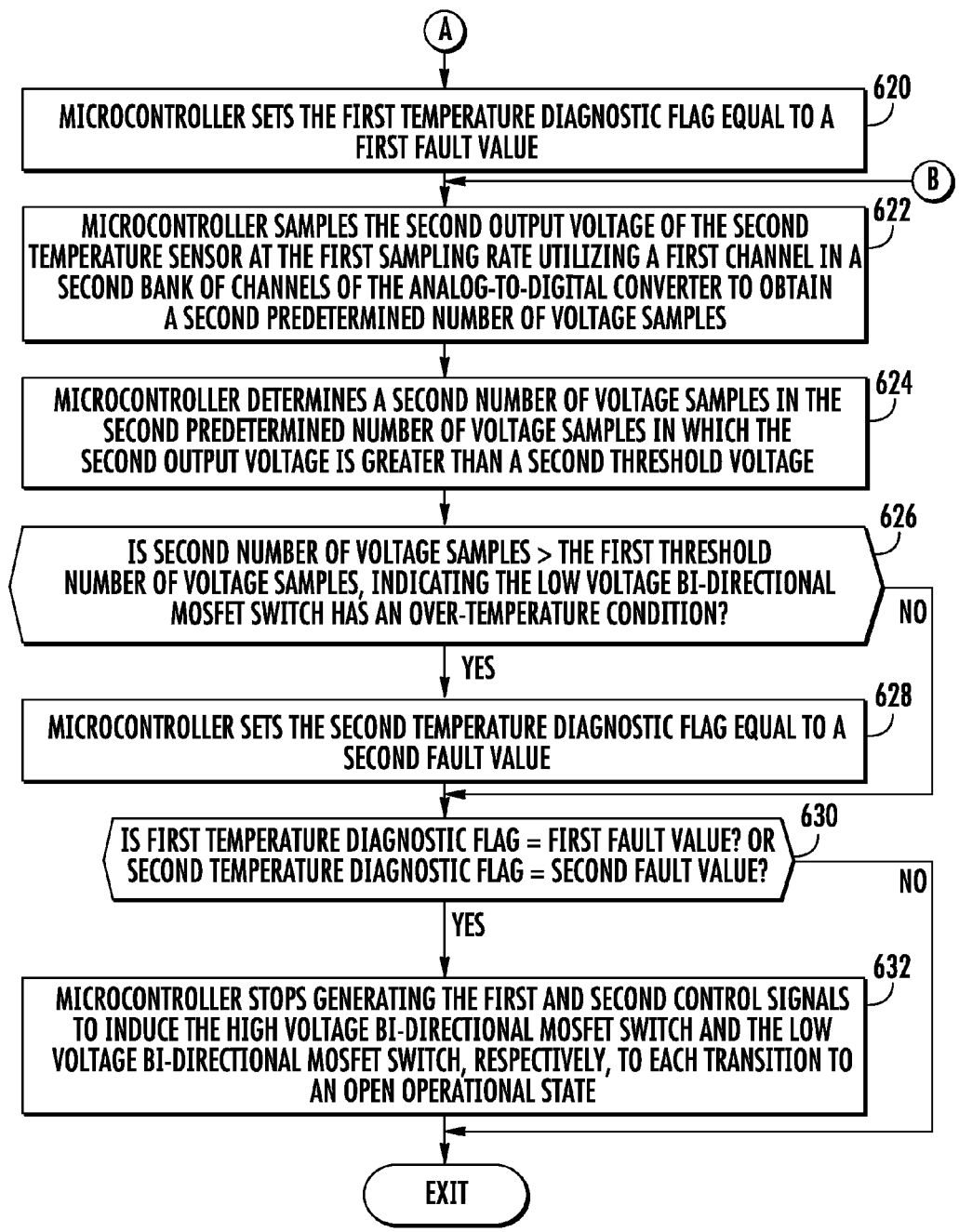
Figure 5:
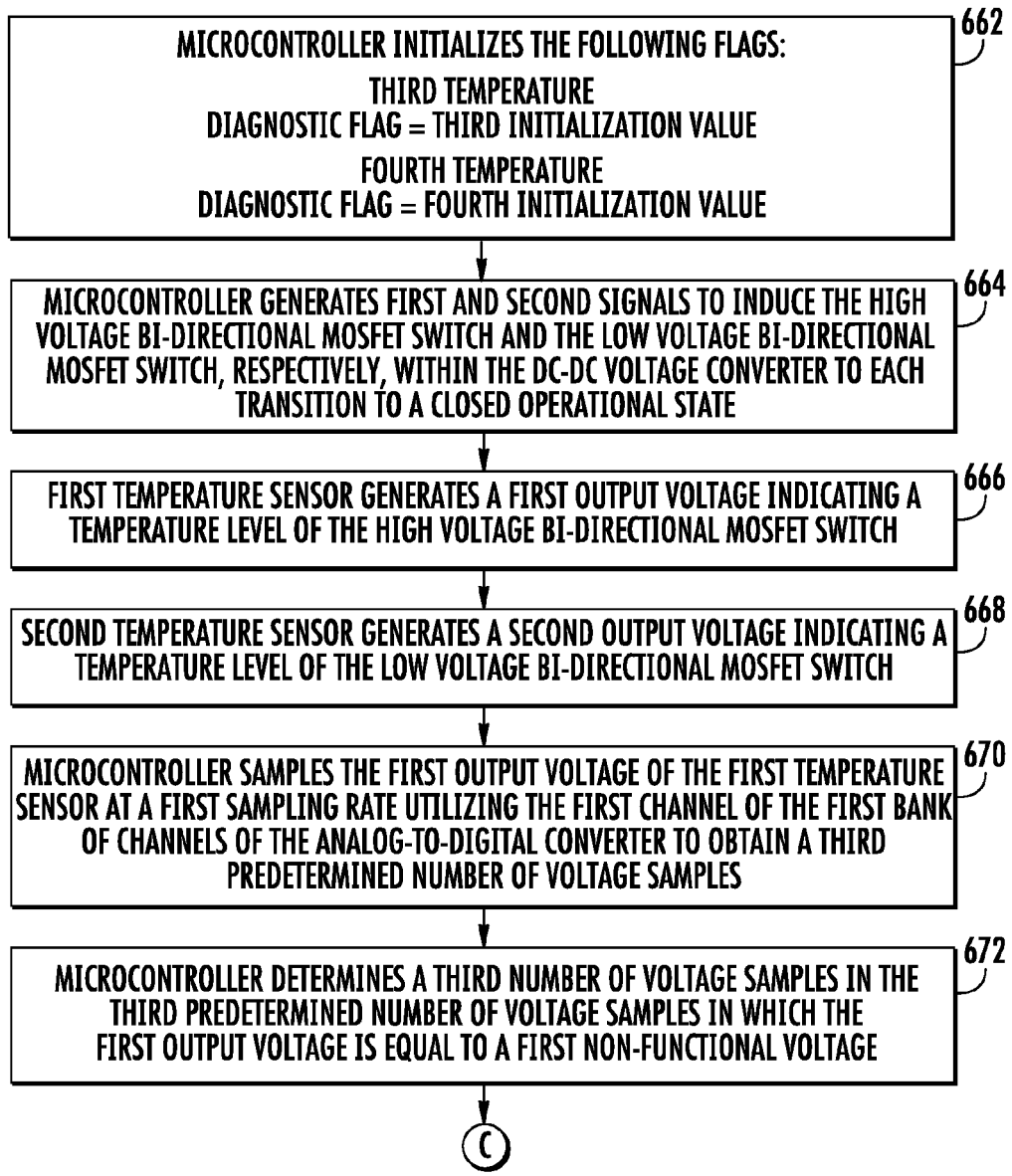
FIGS. 5-7 is a flowchart of a method for performing a second diagnostic test of the DC-DC voltage converter of FIG. 1.
Figure 6:
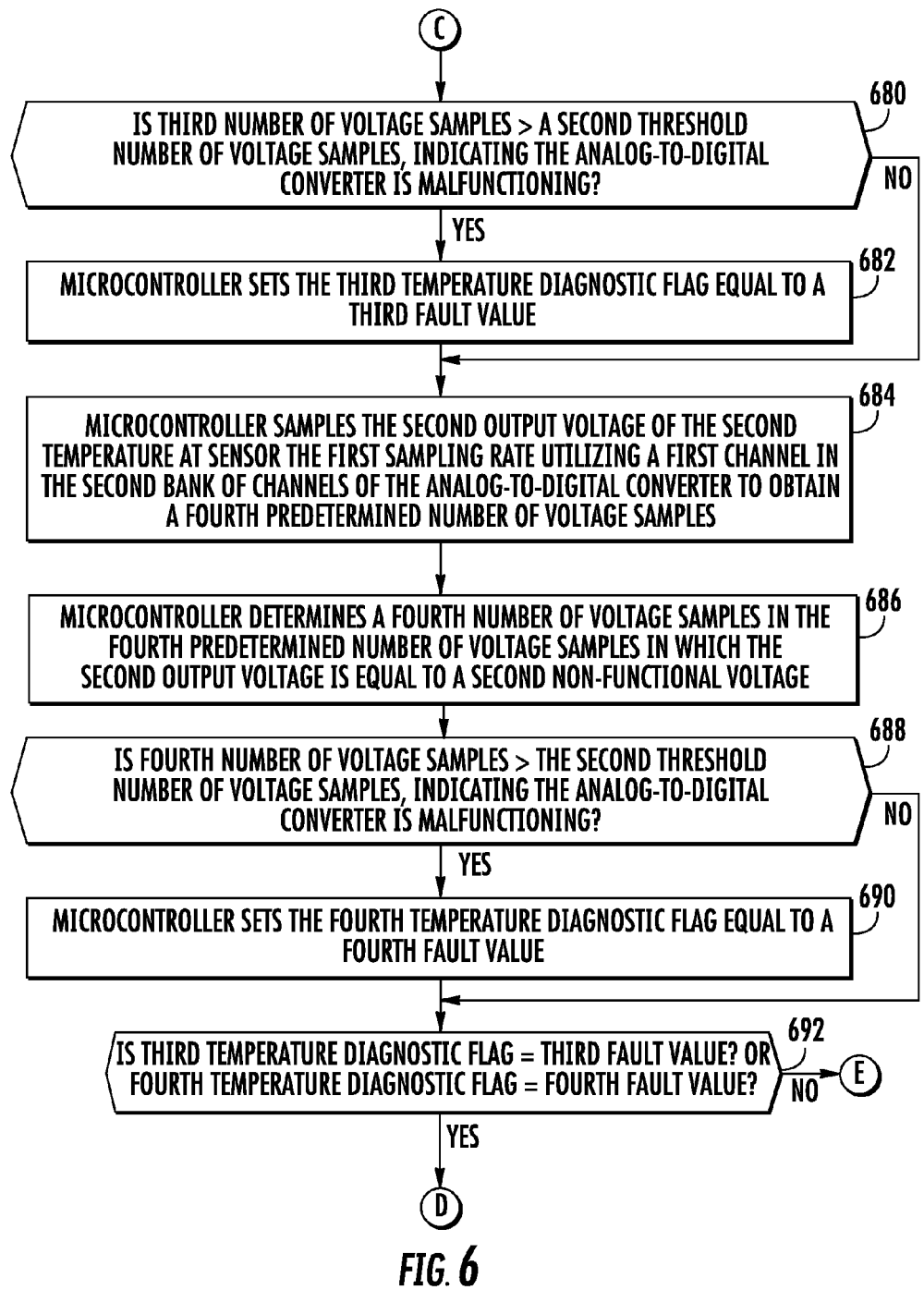
Figure 7:
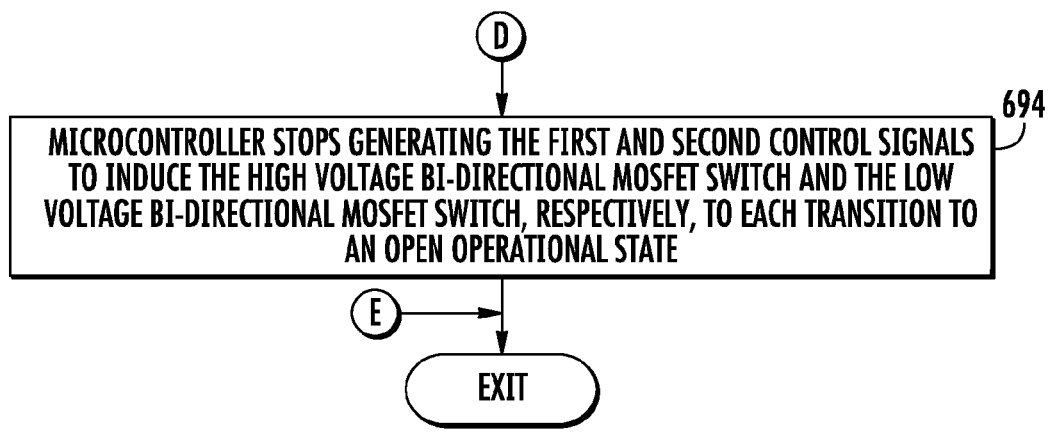
Figure 8:
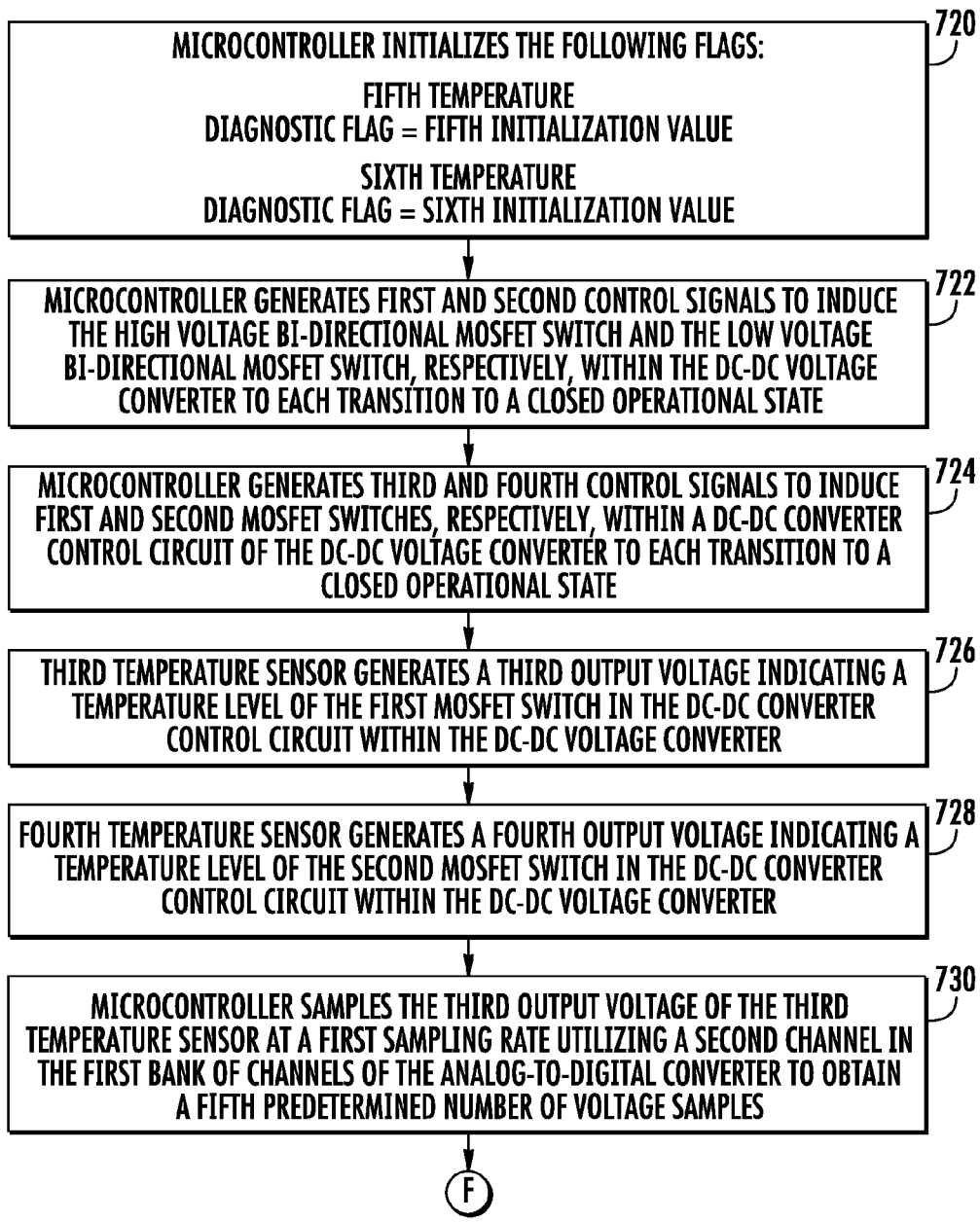
FIGS. 8-10 is a flowchart of a method for performing a third diagnostic test of the DC-DC voltage converter of FIG. 1.
Figure 9:
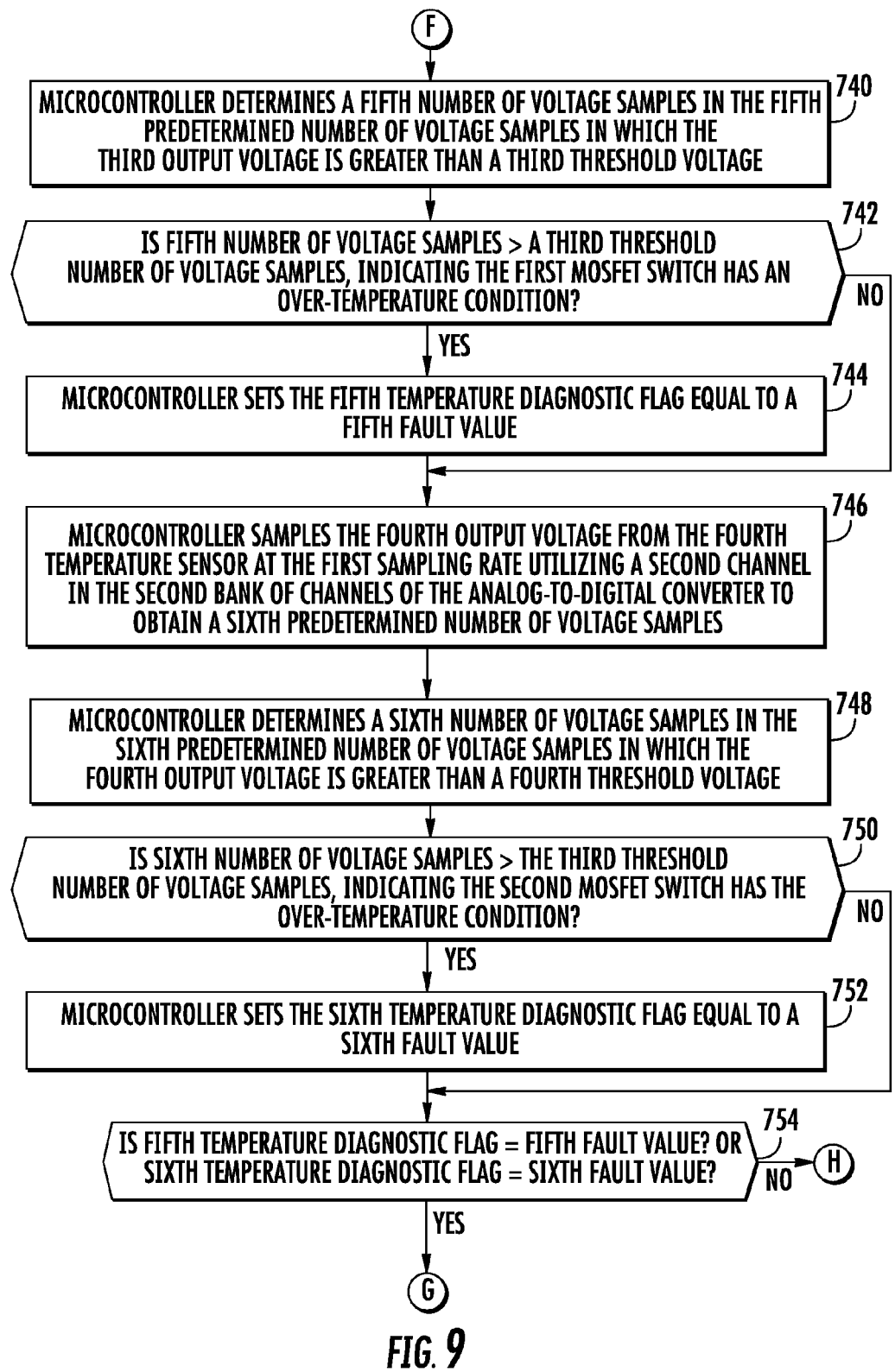
Figure 10:
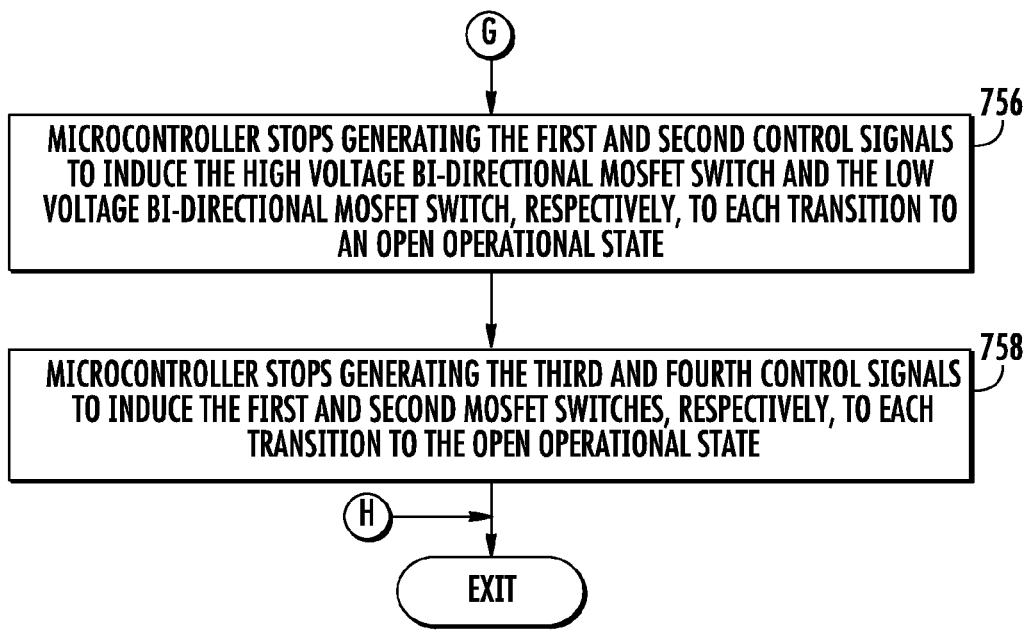
Figure 11:
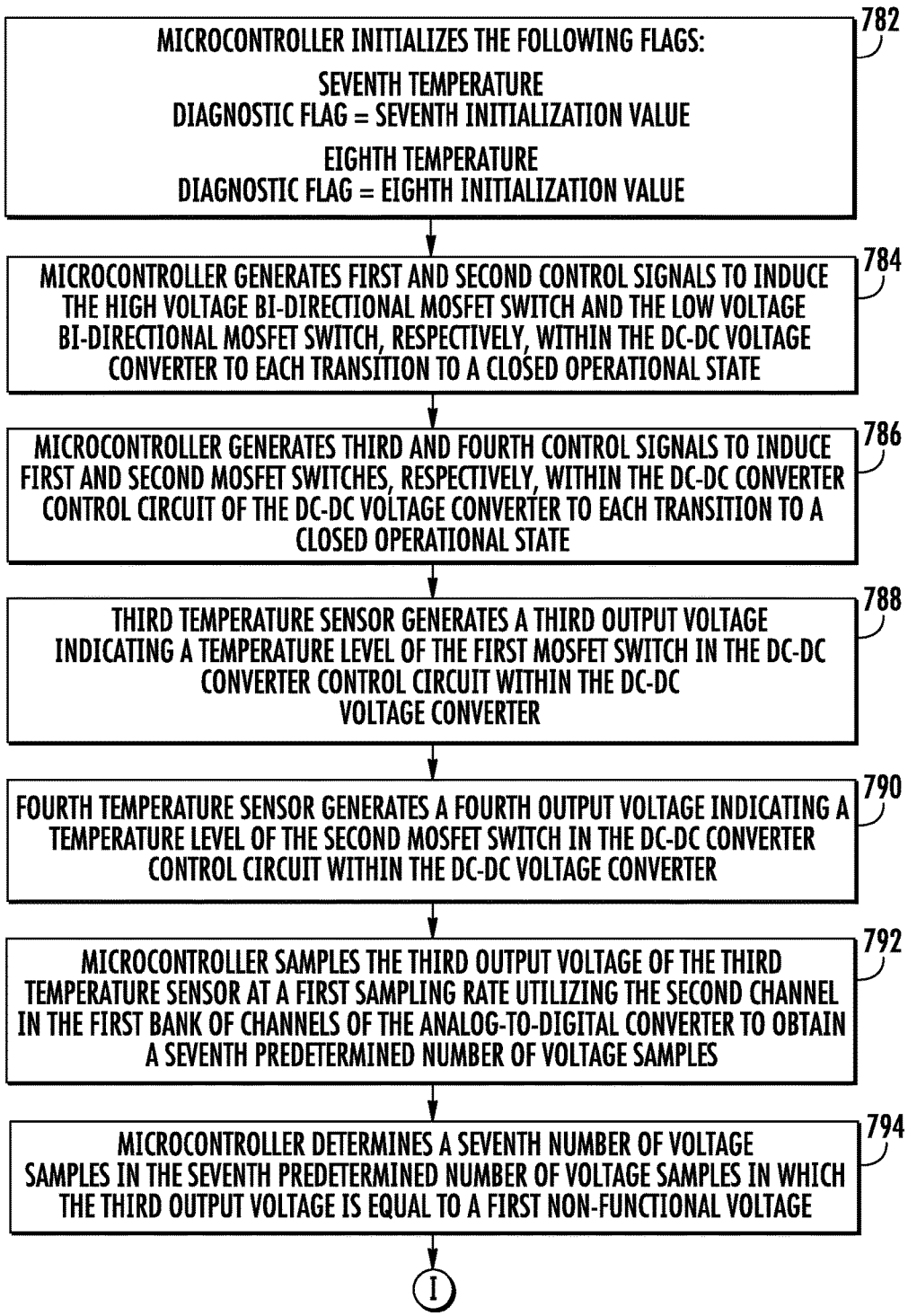
FIGS. 11-13 is a flowchart of a method for performing a fourth diagnostic test of the DC-DC voltage converter of FIG. 1.
Figure 12:
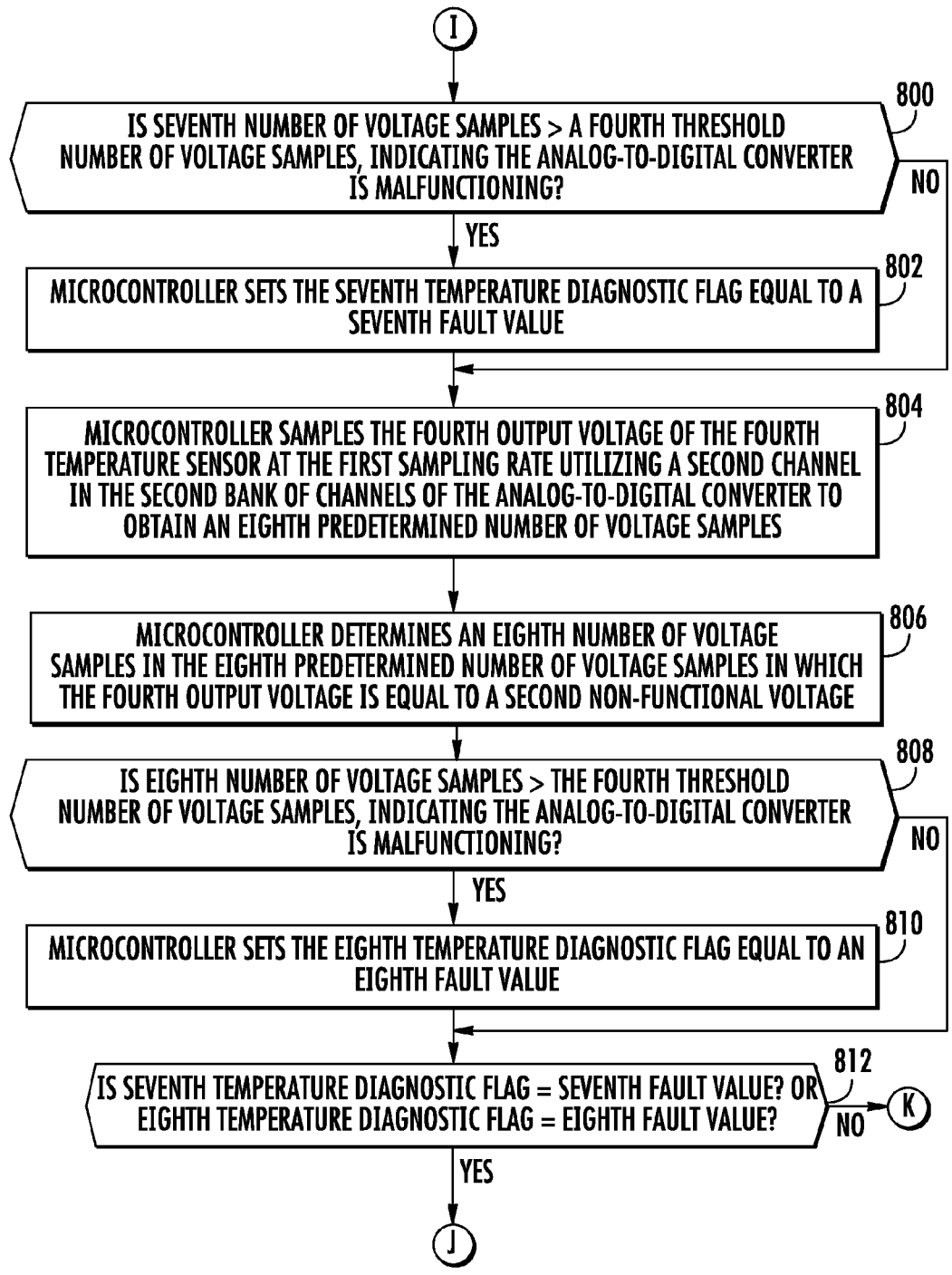
Figure 13:
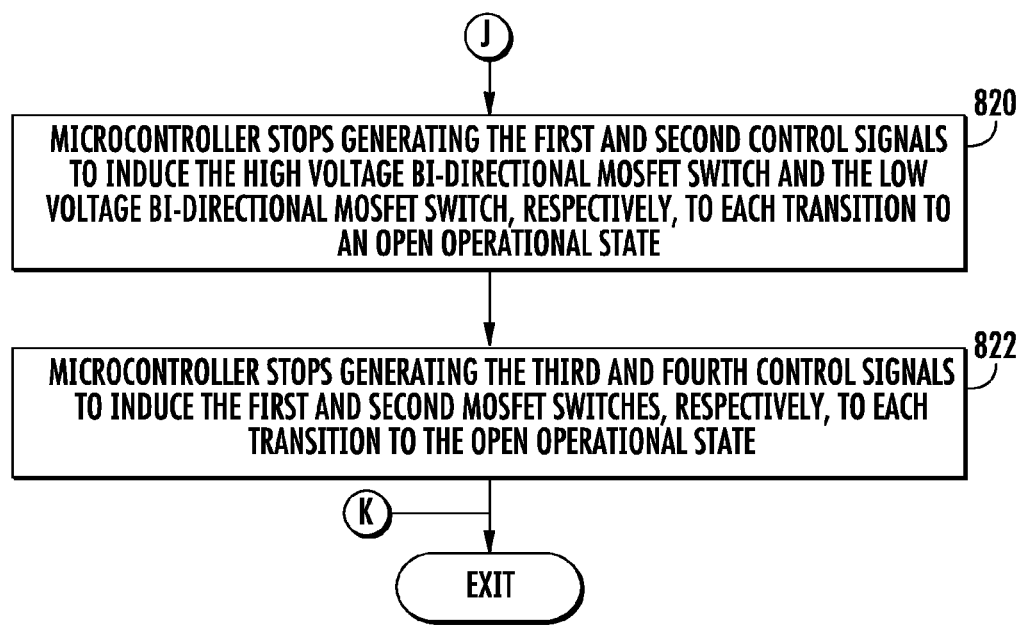

Referring to FIGS. 1, 3 and 4, a flowchart of a method for performing a first diagnostic test on the DC-DC voltage converter 160 and for implementing control steps based on the result of the diagnostic test, will now be explained.

At step 600, the microcontroller 60 initializes the following flags:
first temperature diagnostic flag=first initialization value
second temperature diagnostic flag=second initialization value. After step 600, the method advances to step 602.

At step 602, the microcontroller 60 generates first and second control signals to induce the high voltage bi-directional MOSFET switch 340 and the low voltage bi-directional MOSFET switch 344, respectively, within the DC-DC voltage converter 160 to each transition to a closed operational state. After step 602, the method advances to step 604.

At step 604, the first temperature sensor 400 generates a first output voltage indicating a temperature level of the high voltage bi-directional MOSFET switch 340. After step 604, the method advances to step 606.

At step 606, the second temperature sensor 404 generates a second output voltage indicating a temperature level of the low voltage bi-directional MOSFET switch 344. After step 606, the method advances to step 608.

At step 608, the microcontroller 60 samples the first output voltage of the first temperature sensor 400 at a first sampling rate utilizing a first channel 94 in a first bank of channels 76 of an analog-to-digital converter 74 to obtain a first predetermined number of voltage samples. After step 608, the method advances to step 610.

At step 610, the microcontroller 60 determines a first number of voltage samples in the first predetermined number of voltage samples in which the first output voltage is greater than a first threshold voltage. After step 610, the method advances to step 612.

At step 612, the microcontroller 60 makes a determination as to whether the first number of voltage samples is greater than a first threshold number of voltage samples, indicating the high voltage bi-directional MOSFET switch 340 has an over-temperature condition. If the value of step 612 equals "yes", the method advances to step 620. Otherwise, the method advances to step 622.

At step 620, the microcontroller 60 sets the first temperature diagnostic flag equal to a first fault value. After step 620, the method advances to step 622.

At step 622, the microcontroller 60 samples the second output voltage of the second temperature sensor 404 at the first sampling rate utilizing a first channel 96 in a second bank of channels 78 of the analog-to-digital converter 74 to obtain a second predetermined number of voltage samples. After step 622, the method advances to step 624.

At step 624, the microcontroller 60 determines a second number of voltage samples in the second predetermined number of voltage samples in which the second output voltage is greater than a second threshold voltage. After step 624, the method advances to step 626.

At step 626, the microcontroller 60 makes a determination as to whether the second number of voltage samples is greater than the first threshold number of voltage samples, indicating the low voltage bi-directional MOSFET switch 344 has the over-temperature condition. If the value of step 626 equals "yes", the method advances to step 628. Otherwise, the method advances to step 630.

At step 628, the microcontroller 60 sets the second temperature diagnostic flag equal to a second first fault value. After step 628, the method advances to step 630.

At step 630, the microcontroller 60 makes a determination as to whether the first temperature diagnostic flag is equal to the first fault value, or whether the second temperature diagnostic flag is equal to the second fault value. If the value of step 630 equals "yes", the method advances to step 632. Otherwise, the method is exited.

At step 632, the microcontroller 60 stops generating the first and second control signals to induce the high voltage bi-directional MOSFET switch 340 and the low voltage bi-directional MOSFET switch 344, respectively, to each transition to an open operational state. After step 632, the method is exited.

Referring to FIGS. 1 and 5-7, a flowchart of a method for performing a second diagnostic test on the DC-DC voltage converter 160 and for implementing control steps based on the result of the diagnostic test, will now be explained.

At step 662, the microcontroller 60 initializes the following flags:
third temperature diagnostic flag=third initialization value
fourth temperature diagnostic flag=fourth initialization value. After step 662, the method advances to step 664.

At step 664, the microcontroller 60 generates first and second control signals to induce the high voltage bi-directional MOSFET switch 340 and the low voltage bi-directional MOSFET switch 344, respectively, within the DC-DC voltage converter 160 to each transition to a closed operational state. After step 664, the method advances to step 666.

At step 666, the first temperature sensor 400 generates a first output voltage indicating a temperature level of the high voltage bi-directional MOSFET switch 340. After step 666, method advances to step 668.

At step 668, the second temperature sensor 404 generates a second output voltage indicating a temperature level of the low voltage bi-directional MOSFET switch 344. After step 668, the method advances to step 670.

At step 670, the microcontroller 60 samples the first output voltage of the first temperature sensor 400 at a first sampling rate utilizing the first channel 94 of the first bank of channels 76 in the analog-to-digital converter 74 to obtain a third predetermined number of voltage samples. After step 670, the method advances to step 672.

At step 672, the microcontroller 60 determines a third number of voltage samples in the third predetermined number of voltage samples in which the first output voltage is equal to a first non-functional voltage. After step 672, the method advances to step 680.

At step 680, the microcontroller 60 makes a determination as to whether the third number of voltage samples is greater than a second threshold number of voltage samples, indicating either the analog-to-digital converter 74 is malfunctioning. If the value of step 680 equals "yes", the method advances to step 682. Otherwise, the method advances to step 684.

At step 682, the microcontroller 60 sets the third temperature diagnostic flag equal to a third fault value. After step 682, the method advances to step 684.

At step 684, the microcontroller 60 samples the second output voltage of the second temperature sensor 404 at the first sampling rate utilizing a first channel 96 in the second bank of channels 78 of the analog-to-digital converter 74 to obtain a fourth predetermined number of voltage samples. After step 684, the method advances to step 686.

At step 686, the microcontroller 60 determines a fourth number of voltage samples in the fourth predetermined number of voltage samples in which the second output voltage is equal to a second non-functional voltage. After step 686, the method advances to step 688.

At step 688, the microcontroller 60 makes a determination as to whether the fourth number of voltage samples is greater than the second threshold number of voltage samples, indicating the analog-to-digital converter 74 is malfunctioning. If the value of step 688 equals "yes", the method advances to step 690. Otherwise, the method advances to step 692.

At step 690, the microcontroller 60 sets the fourth temperature diagnostic flag equal to a fourth fault value. After step 690, the method advances to step 692.

At step 692, the microcontroller 60 makes a determination as to whether the third temperature diagnostic flag is equal to the third fault value, or whether the fourth temperature diagnostic flag is equal to the fourth fault value. If the value of step 692 equals "yes", the method advances to step 694. Otherwise, the method is exited.

At step 694, the microcontroller 60 stops generating the first and second control signals to induce the high voltage bi-directional MOSFET switch 340 and the low voltage bi-directional MOSFET switch 344, respectively, to each transition to an open operational state. After step 694, the method is exited.

Referring to FIGS. 1 and 8-10, a flowchart of a method for performing a third diagnostic test on the DC-DC voltage converter 160 and for implementing control steps based on the result of the diagnostic test, will now be explained.

At step 720, the microcontroller 60 initializes the following flags:
fifth temperature diagnostic flag=fifth initialization value
sixth temperature diagnostic flag=sixth initialization value.
After step 720, the method advances to step 722.

At step 722, the microcontroller 60 generates first and second control signals to induce the high voltage bi-directional MOSFET switch 340 and the low voltage bi-directional MOSFET switch 344, respectively, within the DC-DC voltage converter 160 to each transition to a closed operational state. After step 722, the method advances to step 724.

At step 724, the microcontroller 60 generates third and fourth control signals to induce first and second MOSFET switches 550, 560, respectively, within the DC-DC converter control circuit 342 of the DC-DC voltage converter 160 to each transition to a closed operational state. After step 724, the method advances to step 726.

At step 726, the third temperature sensor 552 generates a third output voltage indicating a temperature level of the first MOSFET switch 550 in the DC-DC converter control circuit 342 within the DC-DC voltage converter 160. After step 726, the method advances to step 728.

At step 728, the fourth temperature sensor 562 generates a fourth output voltage indicating a temperature level of the second MOSFET switch 560 in the DC-DC converter control circuit 342 within the DC-DC voltage converter 160. After step 728, the method advances to step 730.

At step 730, the microcontroller 60 samples the third output voltage of the third temperature sensor 552 at a first sampling rate utilizing a second channel 95 in the first bank of channels 76 of the analog-to-digital converter 74 to obtain a fifth predetermined number of voltage samples. After step 730, the method advances to step 740.

At step 740, the microcontroller 60 determines a fifth number of voltage samples in the fifth predetermined number of voltage samples in which the third output voltage is greater than a third threshold voltage. After step 740, the method advances to step 742.

At step 742, the microcontroller 60 makes a determination as to whether the fifth number of voltage samples is greater than a third threshold number of voltage samples, indicating the first MOSFET switch 550 has an over-temperature condition. If the value of step 742 equals "yes", the method advances to step 744. Otherwise, the method advances to step 746.

At step 744, the microcontroller 60 sets the fifth temperature diagnostic flag equal to a fifth fault value. After step 744, the method advances to step 746.

At step 746, the microcontroller 60 samples the fourth output voltage from the fourth temperature sensor 562 at the first sampling rate utilizing a second channel 97 in the second bank of channels 78 of the analog-to-digital converter 74 to obtain a sixth predetermined number of voltage samples. After step 746, the method advances to step 748.

At step 748, the microcontroller 60 determines a sixth number of voltage samples in the sixth predetermined number of voltage samples in which the fourth output voltage is greater than a fourth threshold voltage. After step 748, the method advances to step 750.

At step 750, the microcontroller 60 makes a determination as to whether the sixth number of voltage samples is greater than the third threshold number of voltage samples, indicating the second MOSFET switch 560 has the over-temperature condition. If the value of step 750 equals "yes", the method advances to step 752. Otherwise, the method advances to step 754.

At step 752, the microcontroller 60 sets the sixth temperature diagnostic flag equal to a sixth first fault value. After step 752, the method advances to step 754.

At step 754, the microcontroller 60 makes a determination as to whether the fifth temperature diagnostic flag is equal to the fifth fault value or whether the sixth temperature diagnostic flag is equal to the sixth fault value. If the value of step 754 equals "yes", the method advances to step 756. Otherwise, the method is exited.

At step 756, the microcontroller 60 stops generating the first and second control signals to induce the high voltage bi-directional MOSFET switch 340 and the low voltage bi-directional MOSFET switch 344, respectively, to each transition to an open operational state. After step 756, the method advances to step 758.

At step 758, the microcontroller 60 stops generating the third and fourth control signals to induce the first and second MOSFET switches 550, 560, respectively, to each transition to the open operational state. After step 758, the method is exited.

Referring to FIGS. 1 and 11-13, a flowchart of a method for performing a fourth diagnostic test on the DC-DC voltage converter 160 and for implementing control steps based on the result of the diagnostic test, will now be explained.

At step 782, the microcontroller 60 initializes the following flags: seventh temperature diagnostic flag=seventh initialization value eighth temperature diagnostic flag=eighth initialization value. After step 782, the method advances to step 784.

At step 784, the microcontroller 60 generates first and second control signals to induce the high voltage bi-directional MOSFET switch 340 and the low voltage bi-directional MOSFET switch 344, respectively, within the DC-DC voltage converter 160 to each transition to a closed operational state. After step 784, the method advances to step 786.

At step 786, the microcontroller 60 generates third and fourth control signals to induce first and second MOSFET switches 550, 560, respectively, within the DC-DC converter control circuit 342 of the DC-DC voltage converter 160 to each transition to a closed operational state. After step 786, the method advances to step 788.

At step 788, the third temperature sensor 552 generates a third output voltage of the third temperature sensor 552 indicating a temperature level of the first MOSFET switch 550 in the DC-DC converter control circuit 342 within the DC-DC voltage converter 160. After step 788, the method advances to step 790.

At step 790, the fourth temperature sensor 562 generates a fourth output voltage indicating a temperature level of the second MOSFET switch 560 in the DC-DC converter control circuit 342 within the DC-DC voltage converter 160. After step 790, method advances to step 792.

At step 792, the microcontroller 60 samples the third output voltage of the third temperature sensor 552 at a first sampling rate utilizing the second channel 95 in the first bank of channels 76 of the analog-to-digital converter 74 to obtain a seventh predetermined number of voltage samples. After step 792, the method advances to step 794.

At step 794, the microcontroller 60 determines a seventh number of voltage samples in the seventh predetermined number of voltage samples in which the third output voltage is equal to a first non-functional voltage. After step 794, the method advances to step 800.

At step 800, the microcontroller 60 makes a determination as to whether the seventh number of voltage samples is greater than a fourth threshold number of voltage samples, indicating the analog-to-digital converter 74 is malfunctioning. If the value of step 800 equals "yes", the method advances to step 802. Otherwise, the method advances to step 804.

At step 802, the microcontroller 60 sets the seventh temperature diagnostic flag equal to a seventh fault value. After step 802, the method advances to step 804.

At step 804, the microcontroller 60 samples the fourth output voltage of the fourth temperature sensor 562 at the first sampling rate utilizing a second channel 97 in the second bank of channels 78 of the analog-to-digital converter 74 to obtain an eighth predetermined number of voltage samples. After step 804, the method advances to step 806.

At step 806, the microcontroller 60 determines an eighth number of voltage samples in the eighth predetermined number of voltage samples in which the fourth output voltage is equal to a second non-functional voltage. After step 806, the method advances to step 808.

At step 808, the microcontroller 60 makes a determination as to whether the eighth number of voltage samples is greater than the fourth threshold number of voltage samples, indicating the analog-to-digital converter 74 is malfunctioning. If the value of step 808 equals "yes", the method advances to step 810. Otherwise, the method advances to step 812.

At step 810, the microcontroller 60 sets the eighth temperature diagnostic flag equal to an eighth fault value. After step 810, the method advances to step 812.

At step 812, the microcontroller 60 makes a determination as to whether the seventh temperature diagnostic flag is equal to the seventh fault value, or whether the eighth temperature diagnostic flag is equal to the eighth fault value. If the value of step 812 equals "yes", the method advances to step 820. Otherwise, the method is exited.

At step 820, the microcontroller 60 stops generating first and second control signals to induce the high voltage bi-directional MOSFET switch 340 and the low voltage bi-directional MOSFET switch 344, respectively, to each transition to an open operational state. After step 820, the method advances to step 822.

At step 822, the microcontroller 60 stops generating third and fourth control signals to induce the first and second MOSFET switches 550, 560, respectively, to each transition to the open operational state. After step 822, the method is exited.

The diagnostic system for a DC-DC voltage converter described herein provides a substantial advantage over other systems and methods. In particular, the diagnostic system provides a technical effect of obtaining diagnostic diversity by sampling a first output voltage from a first temperature sensor using a first channel of a first bank of channels in an analog-to-digital converter, and then sampling a second output voltage from a second temperature sensor using a first channel of a second bank of channels in the analog-to-digital converter, to determine over-temperature conditions in a high voltage bi-directional MOSFET switch and a low voltage bi-directional MOSFET switch, respectively, in the DC-DC voltage converter, and if so, then inducing the high voltage bi-directional MOSFET switch and the low voltage bi-directional MOSFET switch to each transition to an open operational state.

While the claimed invention has been described in detail in connection with only a limited number of embodiments, it should be readily understood that the invention is not limited to such disclosed embodiments. Rather, the claimed invention can be modified to incorporate any number of variations, alterations, substitutions or equivalent arrangements not heretofore described, but which are commensurate with the spirit and scope of the invention. Additionally, while various embodiments of the claimed invention have been described, it is to be understood that aspects of the invention may include only some of the described embodiments. Accordingly, the claimed invention is not to be seen as limited by the foregoing description.

What is claimed is:

1. A diagnostic system for a DC-DC voltage converter, the DC-DC voltage converter having a high voltage bi-directional MOSFET switch and a low voltage bi-directional MOSFET switch, comprising:

a first temperature sensor generating a first output voltage indicating a temperature level of the high voltage bi-directional MOSFET switch;

a second temperature sensor generating a second output voltage indicating a temperature level of the low voltage bi-directional MOSFET switch;

a microcontroller having an analog-to-digital converter, the analog-to-digital converter having a first bank of channels and a second bank of channels; the first bank of channels including a first channel, the second bank of channels including a second channel;

the first channel being electrically coupled to the first temperature sensor for receiving the first output voltage;

the second channel being electrically coupled to the second temperature sensor for receiving the second output voltage;

the microcontroller being programmed to sample the first output voltage at a first sampling rate utilizing the first channel in the first bank of channels to obtain a first predetermined number of voltage samples;

the microcontroller being further programmed to determine a first number of voltage samples in the first predetermined number of voltage samples in which the first output voltage is greater than a first threshold voltage;

the microcontroller being further programmed to set a first temperature diagnostic flag equal to a first fault value if the first number of voltage samples is greater than a first threshold number of voltage samples indicating the high voltage bi-directional MOSFET switch has an over-temperature condition;

the microcontroller being further programmed to sample the second output voltage at the first sampling rate utilizing the second channel in the second bank of channels to obtain a second predetermined number of voltage samples;

the microcontroller being further programmed to determine a second number of voltage samples in the second predetermined number of voltage samples in which the second output voltage is greater than a second threshold voltage; and the microcontroller being further programmed to set a second temperature diagnostic flag equal to a second first fault value if the second number of voltage samples is greater than the first threshold number of voltage samples indicating the low voltage bi-directional MOSFET switch has the over-temperature condition.

2. The diagnostic system of claim 1, wherein:
the microcontroller being further programmed to stop generating first and second control signals to induce the high voltage bi-directional MOSFET switch and the low voltage bi-directional MOSFET switch, respectively, to each transition to an open operational state, if the first temperature diagnostic flag is equal to the first fault value, or the second temperature diagnostic flag is equal to the second fault value.

3. A diagnostic system for a DC-DC voltage converter, the DC-DC voltage converter having a high voltage bi-directional MOSFET switch and a low voltage bi-directional MOSFET switch, comprising:
a first temperature sensor generating a first output voltage indicating a temperature level of the high voltage bi-directional MOSFET switch;
a second temperature sensor generating a second output voltage indicating a temperature level of the low voltage bi-directional MOSFET switch;
a microcontroller having an analog-to-digital converter, the analog-to-digital converter having a first bank of channels and a second bank of channels; the first bank of channels including a first channel, the second bank of channels including a second channel;
the first channel being electrically coupled to the first temperature sensor for receiving the first output voltage;
the second channel being electrically coupled to the second temperature sensor for receiving the second output voltage;
the microcontroller being programmed to sample the first output voltage at a first sampling rate utilizing the first channel in the first bank of channels to obtain a first predetermined number of voltage samples;
the microcontroller being further programmed to determine a first number of voltage samples in the first predetermined number of voltage samples in which the first output voltage is equal to a first non-functional voltage;

the microcontroller being further programmed to set a first temperature diagnostic flag equal to a first fault value if the first number of voltage samples is greater than a first threshold number of voltage samples indicating that the analog-to-digital converter is malfunctioning;

the microcontroller being further programmed to sample the second output voltage at the first sampling rate utilizing the second channel in the second bank of channels to obtain a second predetermined number of voltage samples;

the microcontroller being further programmed to determine a second number of voltage samples in the second predetermined number of voltage samples in which the second output voltage is equal to a second non-functional voltage; and the microcontroller being further programmed to set a second temperature diagnostic flag equal to a second first fault value if the second number of voltage samples is greater than the first threshold number of voltage samples indicating the analog-to-digital converter is malfunctioning.

4. The diagnostic system of claim 3, wherein:
the microcontroller being further programmed to stop generating first and second control signals to induce the high voltage bi-directional MOSFET switch and the low voltage bi-directional MOSFET switch, respectively, to each transition to an open operational state, if the first temperature diagnostic flag is equal to the first fault value, or the second temperature diagnostic flag is equal to the second fault value.

5. A diagnostic system for a DC-DC voltage converter, the DC-DC voltage converter having first and second MOSFET switches in a DC-DC converter control circuit, comprising:
a first temperature sensor generating a first output voltage indicating a temperature level of the first MOSFET switch;
a second temperature sensor generating a second output voltage indicating a temperature level of the second MOSFET switch;
a microcontroller having an analog-to-digital converter, the analog-to-digital converter having a first bank of channels and a second bank of channels; the first bank of channels including a first channel, the second bank of channels including a second channel;
the first channel being electrically coupled to the first temperature sensor for receiving the first output voltage;
the second channel being electrically coupled to the second temperature sensor for receiving the second output voltage;
the microcontroller being programmed to sample the first output voltage at a first sampling rate utilizing the first channel in the first bank of channels to obtain a first predetermined number of voltage samples;
the microcontroller being further programmed to determine a first number of voltage samples in the first predetermined number of voltage samples in which the first output voltage is greater than a first threshold voltage;
the microcontroller being further programmed to set a first temperature diagnostic flag equal to a first fault value if the first number of voltage samples is greater than a first threshold number of voltage samples indicating the first MOSFET switch has an over-temperature condition;
the microcontroller being further programmed to sample the second output voltage at the first sampling rate utilizing the second channel in the second bank of channels to obtain a second predetermined number of voltage samples;

the microcontroller being further programmed to determine a second number of voltage samples in the second predetermined number of voltage samples in which the second output voltage is greater than a second threshold voltage; and the microcontroller being further programmed to set a second temperature diagnostic flag equal to a second first fault value if the second number of voltage samples is greater than the first threshold number of voltage samples indicating the second MOSFET switch has the over-temperature condition.

6. The diagnostic system of claim 5, wherein:

the microcontroller being further programmed to stop generating first and second control signals to induce the high voltage bi-directional MOSFET switch and the low voltage bi-directional MOSFET switch, respectively, to each transition to an open operational state, if the first temperature diagnostic flag is equal to the first fault value, or the second temperature diagnostic flag is equal to the second fault value;

and the microcontroller being further programmed to stop generating third and fourth control signals to induce the first and second MOSFET switches, respectively, to each transition to the open operational state, if the first temperature diagnostic flag is equal to the first fault value, or the second temperature diagnostic flag is equal to the second fault value.

7. A diagnostic system for a DC-DC voltage converter, the DC-DC voltage converter having first and second MOSFET switches in a DC-DC converter control circuit, comprising:

a first temperature sensor generating a first output voltage indicating a temperature level of the first MOSFET switch;

a second temperature sensor generating a second output voltage indicating a temperature level of the second MOSFET switch;

a microcontroller having an analog-to-digital converter, the analog-to-digital converter having a first bank of channels and a second bank of channels; the first bank of channels including a first channel, the second bank of channels including a second channel;

the first channel being electrically coupled to the first temperature sensor for receiving the first output voltage;

the second channel being electrically coupled to the second temperature sensor for receiving the second output voltage;

the microcontroller being programmed to sample the first output voltage at a first sampling rate utilizing the first channel in the first bank of channels to obtain a first predetermined number of voltage samples;

the microcontroller being further programmed to determine a first number of voltage samples in the first predetermined number of voltage samples in which the first output voltage is equal to a first non-functional voltage;

the microcontroller being further programmed to set a first temperature diagnostic flag equal to a first fault value if the first number of voltage samples is greater than a first threshold number of voltage samples indicating the analog-to-digital converter is malfunctioning;

the microcontroller being programmed to sample the second output voltage at the first sampling rate utilizing the second channel in the second bank of channels to obtain a second predetermined number of voltage samples;

the microcontroller being further programmed to determine a second number of voltage samples in the second predetermined number of voltage samples in which the second output voltage is greater than a second threshold voltage;

the microcontroller being further programmed to set a second temperature diagnostic flag equal to a second first fault value if the second number of voltage samples is greater than the first threshold number of voltage samples indicating the analog-to-digital converter is malfunctioning.

8. The diagnostic system of claim 7, wherein:

the microcontroller being further programmed to stop generating first and second control signals to induce the high voltage bi-directional MOSFET switch and the low voltage bi-directional MOSFET switch, respectively, to each transition to an open operational state, if the first temperature diagnostic flag is equal to the first fault value, or the second temperature diagnostic flag is equal to the second fault value; and the microcontroller being further programmed to stop generating third and fourth control signals to induce the first and second MOSFET switches, respectively, to each transition to the open operational state, if the first temperature diagnostic flag is equal to the first fault value, or the second temperature diagnostic flag is equal to the second fault value.

* * * * *